(12) United States Patent
Jeong et al.

(10) Patent No.: US 8,601,330 B2
(45) Date of Patent: Dec. 3, 2013

(54) DEVICE AND METHOD FOR REPAIR ANALYSIS

(75) Inventors: Woo-Sik Jeong, Gyeonggi-do (KR); Kang-Chil Lee, Gyeonggi-do (KR); Jeong-Ho Cho, Gyeonggi-do (KR); Kyoung-Shub Lee, Gyeonggi-do (KR); Il-Kwon Kang, Gyeonggi-do (KR); Sungho Kang, Seoul (KR); Joo Hwan Lee, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 517 days.

(21) Appl. No.: 12/982,809

(22) Filed: Dec. 30, 2010

(65) Prior Publication Data

US 2012/0131396 A1    May 24, 2012

(30) Foreign Application Priority Data

Nov. 23, 2010    (KR) ........................ 10-2010-0116823

(51) Int. Cl.
*G11C 29/00*    (2006.01)

(52) U.S. Cl.
USPC .......... 714/718; 714/5.11; 714/704; 702/132; 702/183; 365/220; 365/226

(58) Field of Classification Search
USPC ................. 714/5.11, 718, 704; 702/132, 183; 365/220, 226
See application file for complete search history.

(56) References Cited

U.S. PATENT DOCUMENTS 6,715,116 B2 *    3/2004    Lester et al. .................. 714/718

FOREIGN PATENT DOCUMENTS

| JP | 2001-043698 | 2/2001 |
|---|---|---|
| KR | 1020010076937 | 8/2001 |
| KR | 1020080110710 | 12/2008 |

OTHER PUBLICATIONS

Wang, "VLSI Test Principles and Architectures: Design for Testability", 2006, Elsevier, p. 461-555.*
Woosik Jeong et al., "An Advanced BIRA for Memories with an Optimal Repair Rate and Fast Analysis Speed by Using a Branch Analyzer."
IEEE Transactions on Computer-Aided Design of Integrated Circuits and Systems, Dec. 2010, pp. 2014-2026, vol. 29, No. 12, IEEE.
Notice of Allowance issued by the Korean Intellectual Property Office on Mar. 19, 2012.
Lu et al., "Efficient Built-In Redundancy Analysis for Embedded Memories With 2-D Redundancy," IEEE Transactions on Very Large Scale Integration (VLSI) Systems, Jan. 2006, pp. 34-42, vol. 14, No. 1, IEEE.
John Day, "A Fault-Driven, Comprehensive Redundancy Algorithm," IEEE Design & Test, Jun. 1985, pp. 35-44, International Test Conference 1984, IEEE.

(Continued)

*Primary Examiner* — Joshua P Lottich
*Assistant Examiner* — Jeison C Arcos
(74) *Attorney, Agent, or Firm* — IP & T Group LLP

(57) ABSTRACT

A device for repair analysis includes a selection unit and an analysis unit. The selection unit is configured to select a part of the row addresses of a plurality of spare pivot fault cells and a part of the column addresses of the spare pivot fault cells in response to a control code. The analysis unit is configured to generate an analysis signal indicating whether row addresses of a plurality of non-spare pivot fault cells are included in selected row addresses and column addresses of the non-spare pivot fault cells are included in selected column addresses.

17 Claims, 9 Drawing Sheets

(56) References Cited

OTHER PUBLICATIONS

Huang et al., "Built-In Redundancy Analysis for Memory Yield Improvement," IEEE Transactions on Reliability, Dec. 2003, pp. 386-399, vol. 52, No. 4, IEEE.

Swapnil Bahl, "A Sharable Built-in Self-repair for Semiconductor Memories with 2-D Redundancy Scheme," 22nd IEEE International Symposium on Defect and Fault Tolerance in VLSI Systems, 2007, pp. 331-339, IEEE Computer Society.

Tseng et al., "A Reconfigurable Built-In Self-Repair Scheme for Multiple Repairable RAMs in SOCs," International Test Conference, 2006, pp. 1-9, Paper 30.2, IEEE.

Huang et al., "A Built-In Redundancy-Analysis Scheme for Self-Repairable RAMs with Two-Level Redundancy," Proceedings of 21st IEEE International Symposium on Defect and Fault Tolerance in VLSI Systems (DFT'06), 2006, pp. 1-9, IEEE Computer Society.

Ohler et al., "An Integrated Built-in Test and Repair Approach for Memories with 2D Redundancy," 12th IEEE European Test Symposium (ETS' 07), pp. 1-6, IEEE Computer Society.

Lin et al., "An Efficient Algorithm for Spare Allocation Problems," IEEE Transactions on Reliability, Jun. 2006, pp. 369-378, vol. 55, No. 2, IEEE.

Lu et al, "A BIRA Algorithm for Embedded Memories with 2-D Redundancy," Proceedings of the 2005 IEEE International Workshop on Memory Technology, Design, and Testing (MTDT' 05), 2005, IEEE Computer Society.

Lu et al., "Efficient BISR Techniques for Word-Oriented Embedded Memories with Hierarchical Redundancy," Proceedings of the 5th IEEE/ACIS International Conference on Computer and Information Science, 2006, IEEE Computer Society.

Chen et al., "Economic Aspects of Memory Built—in Self-Repair," IEEE Design & Test of Computers, 2007, pp. 164-172, IEEE CS and IEEE CASS.

Jeong et al., "A Fast Built-in Redundancy Analysis for Memories With Optimal Repair Rate Using a Line-Based Search Tree," IEEE Transactions on Very Large Scale Intergration (VLSI) Systems, Dec. 2009, pp. 1665-1678, vol. 17, No. 12, IEEE.

Tseng et al., "ReBISR: A Reconfigurable Built-In Self-Repair Scheme for Random Access Memories in SOCs," IEEE Transactions on Very Large Scale Integration(VLSI) Systems, Jun. 2010, pp. 921-932, vol. 18, No. 6, IEEE.

Tarr et al., "Defect analysis system speeds test and repair of redundant memories," Electronics, Jan. 1984, pp. 175-179.

Kawagoe et al, "A Built-In Self-Repair Analyzer (CRESTA) for embedded DRAMs," ITC International Test Conference, 2000, pp. 567-574, Paper 21.3, IEEE.

Tseng et al., "A Built-In Redundancy-Analysis Scheme for RAMs with 2D Redundancy Using 1D Local Bitmap," 2006, Proceedings of the Conference on Design, Automation and Test in Europe.

Kuo at al., "Efficient Spare Allocation in Reconfigufwble Arrays," 23rd Design Automation Conference, 1986, pp. 385-390, Paper 23.3, IEEE.

Douglas Blough, "Performance Evaluation of a Reconfiguration-Algorithm for Memory Arrays containing Clustered Faults," IEEE Transactions on Reliability, Jun. 1996, pp. 274-284, vol. 45, No. 2, IEEE.

Libeskind-Hadas et al., "Fast Search Algorithms for Reconfiguration Problems," 1991 International Workship on Defect and Fault Tolerance on VLSI Systems, 1991, pp. 260-273, Reconfiguration 2, IEEE.

Wada et al., "Post-Packaging Auto Repair Techniques for Fast Row Cycle Embedded DRAM," ITC International Test Conference, 2004, pp. 1016-1023, Paper 35.4, IEEE.

Pagiamtzis et al, "Content-Addressable Memory (CAM) Circuits and Architectures: A Tutorial and Survey," IEEE Journal of Solid-State Circuits, Mar. 2006, pp. 712-727, vol. 41, No. 3, IEEE.

Woosik Jeong, "Built-in Repair Analysis," Fall workshop 2010, Korea Test Conference Oct. 20th, 2010, pp. 1-38, HYNIX Inc.

Huang et al., "New Approaches for the Repairs of Memories with Redundancy by Row/Column Deletion for Yield Enhancement," IEEE Transactions on Computer-Aided Design, Mar. 1990, pp. 323-328, vol. 9, No. 3, IEEE.

\* cited by examiner

DEVICE AND METHOD FOR REPAIR ANALYSIS

CROSS-REFERENCE(S) TO RELATED APPLICATIONS

The present application claims priority of Korean Patent Application No. 10-2010-0116823, filed on Nov. 23, 2010, which is incorporated herein by reference in its entirety.

BACKGROUND OF THE INVENTION

Exemplary embodiments of the present invention relate to semiconductor memory devices, and more particularly, to a repair analysis device and method for calculating a repair solution by using information about a fault cell detected in a memory device.

In the early stage of semiconductor memory industry, a wafer with a larger number of original good semiconductor dies with no defective cell could be produced in a semiconductor fabrication process. However, as the memory capacity has increased, it has become difficult to fabricate a memory chip without any fault cell.

Accordingly, a method for replacing a fault memory cell with a spare memory cell (i.e., a redundancy memory cell) has been proposed. In order to replace a fault memory cell with a redundancy memory cell, an external equipment has been used to calculate a path to the replacement. More recently, however, such a repair circuit has been installed in a memory chip.

Three main parameters to be considered for a memory self-repair circuit may be an area overhead, a repair rate, and an analysis speed of a repair circuit. The area overhead is a parameter connected directly with the semiconductor chip fabrication cost. The repair rate is an important parameter connected with the yield of the semiconductor chip. The analysis speed of a repair circuit may also be regarded as a parameter connected directly with the semiconductor chip fabrication cost, because it is proportional to a test time.

A built-in self repair analyzer (CRESTA) is disclosed in a prior art 1 (T. Kawagoe, J. Ohtani, M. Niiro, T. Ooishi, M. Hamada, and H. Hidaka, "A built-in self repair analyzer (CRESTA) for embedded DRAMs" in Proc. Int. Test Conf., pp. 567-574, October 2000). The CRESTA of the prior art 1 is a relatively widely known redundancy analysis operation circuit. Among the conventional redundancy analysis operation circuits, the CRESTA of the prior art 1 has the highest repair rate (a repair rate of 100% if a repair solution is present) and the highest redundancy analysis operation speed. With respect to a redundancy sequence available by a given redundancy circuit, all cases are implemented using an auxiliary operation circuit, and thus analysis operations may be simultaneously performed on all the cases. Accordingly, the repair rate and the analysis operation speed can be optimized. However, the CRESTA of the prior art 1 is to install separate auxiliary operation circuits for all the cases, respectively. Therefore, the CRESTA of the prior art 1 exponentially increases the area overhead if the number of cases of a redundancy sequence increases due to an increase in the number of redundancy cells.

An "intelligent solve first" method is disclosed in a prior art 2 (P. Ohler, S. Hellebrand, and H.-J. Wunderlich, "An Integrated Built-in Test and Repair Approach for Memories with 2D Redundancy" in Proc. European Test Symposium (ETS), pp. 91-96, May 2007). The "intelligent solve first" method of the prior art 2 is a relatively recent method based on a branch-and-bound algorithm. The "intelligent solve first" method of the prior art 2 excludes a must-repair line from a binary tree structure, thereby securing a relatively low area overhead and the optimal repair rate. However, the "intelligent solve first" method of the prior art 2 excessively increases a redundancy analysis operation time if the number of faults (i.e., cells) increases or the distribution thereof becomes complicated. Also, the "intelligent solve first" method of the prior art 2 cannot secure the optimal repair solution.

An essential spare pivot (ESP) method is disclosed in a prior art 3 (C.-T. Huang, C.-F. Wu, J.-F. Li, and C.-W. Wu, "Built-in Redundancy Analysis for Memory Yield Improvement, IEEE Trans. Reliability, vol. 52, pp. 386-399, December 2003). The ESP method of the prior art 3 stores only core fault addresses instead of a fault bit map in order to reduce the area overhead. A fault address collecting process is performed during a test process, thus increasing the analysis speed of a self-repair circuit. However, a register capacity for storing fault addresses is insufficient, thus failing to accurately reproduce a fault phenomenon. Therefore, the ESP method cannot secure the optimal repair solution and analysis result.

SUMMARY OF THE INVENTION

An exemplary embodiment of the present invention is directed to reduce the area of a repair analysis device, which calculates a repair solution by analyzing information about a fault cell, and to increase the analysis speed thereof.

In accordance with an exemplary embodiment of the present invention, a device for repair analysis includes: a selection unit configured to select a part of row addresses of a plurality of spare pivot fault cells and a part of column addresses of the spare pivot fault cells in response to a control code; and an analysis unit configured to generate an analysis signal indicating whether row addresses of a plurality of non-spare pivot fault cells are included in selected row addresses and column addresses of the non-spare pivot fault cells are included in selected column addresses.

In accordance with another exemplary embodiment of the present invention, a method for repair analysis includes: selecting a part of row addresses of a plurality of spare pivot fault cells and a part of column addresses of the spare pivot fault cells in response to a control code; and determining whether row addresses of a plurality of non-spare pivot fault cells are included in selected row addresses and column addresses of the non-spare pivot fault cells are included in selected column addresses.

BRIEF DESCRIPTION OF THE DRAWINGS

FIG. 1 illustrates fault cells in a memory device including 8 rows and 8 columns.

FIG. 4 illustrates fault cells detected in a memory device, which includes 8 rows and 8 columns and includes 2 redundancy rows (Rs) and 2 redundancy columns (Cs), and the order of detecting the fault cells.

DESCRIPTION OF SPECIFIC EMBODIMENTS

Figure 2:
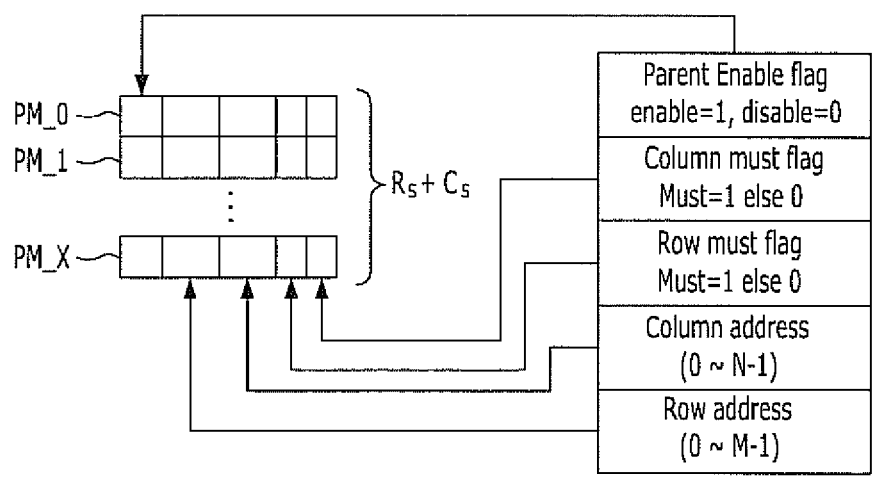
FIG. 2 illustrates a fault information storing device in accordance with an exemplary embodiment of the present invention.
Figure 2:
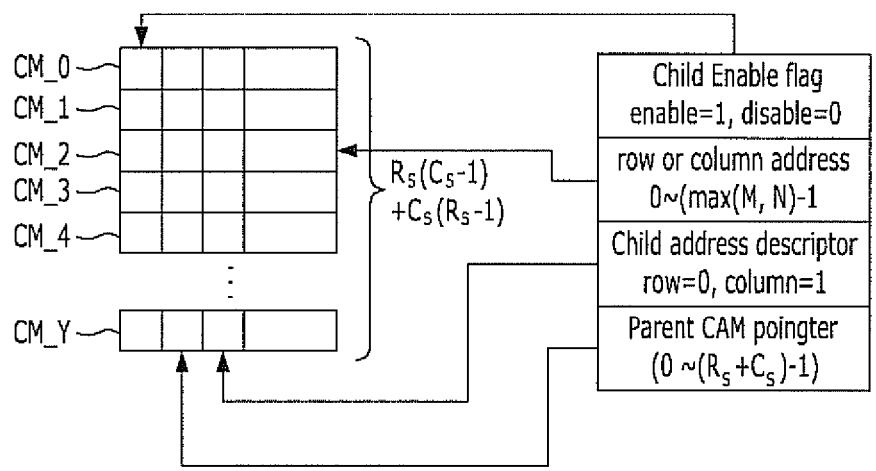

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

First, a repair rate and a fault classification method are described for a better understanding of the present invention.

A. Repair Rate

A repair rate is defined as Equation 1 below.

$$\text{Repair Rate} = \frac{\text{Number of Repaired Chips}}{\text{Number of Repairable Chips}} \quad \text{Eq. 1}$$

The optimal repair rate is 100%. The repair rate becomes 100% if one or more solutions can be found for a repairable fault. In the equation of the repair rate, the denominator is the number of repairable chips. Therefore, the failure to find a solution for a fault-unrepairable case (e.g., the case where the number of fault cells exceeds the number of redundancy memory cells) does not affect the repair rate. In order to increase the repair rate, a fault information storing device is to store complete information on a repair operation.

Figure 1:
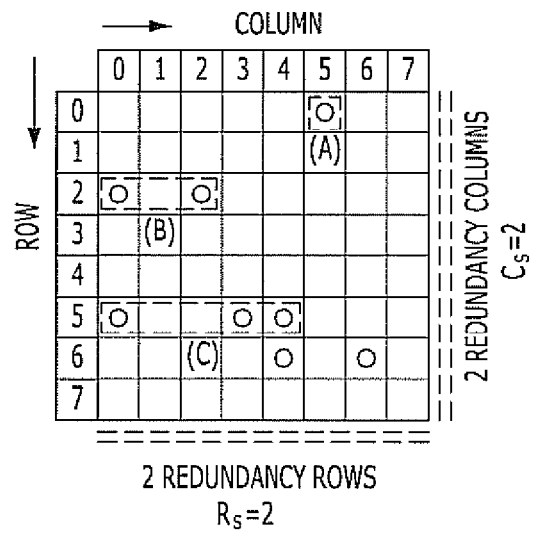

FIG. 1 illustrates fault cells in a memory device including 8 rows and 8 columns. Classification of faults is described below with reference to FIG. 1.

A reference Rs denotes the number of redundancy rows, and a reference Cs denotes the number of redundancy columns. Hereinafter, it is assumed that Rs=2 and Cs=2.

B. Classification of Faults (1) Single Fault

It means a fault in the case when there is no other fault cell at a column and a row where a fault cell is located. Referring to FIG. 1, a fault cell A located at row 0 and column 5 is classified as a single fault.

A single fault may be repaired by replacing it with one redundancy row or one redundancy column. For example, the fault cell A of FIG. 1 may be repaired by replacing the row #0 with a redundancy row or replacing the column #5 with a redundancy column.

(2) Sparse Faulty Line

When there are k ($1 < k \leq Cs$) faults at any single row, it is called a row line fault. Also, there are k ($1 < k \leq Rs$) faults at any single column, it is called a column line fault. Thus, the fault cells B of FIG. 1 are classified as a row line fault.

A row line fault may be repaired by replacing it with one redundancy row or k redundancy columns. Also, a column line fault may be repaired by replacing it with one redundancy column or k redundancy rows. For example, the fault cells B of FIG. 1 may be repaired by replacing the row #2 with a redundancy row or replacing the columns #0 and #2 with two redundancy columns.

(3) Must-Repair Faulty Line

When there are k ($k>Cs$) faults at any single row, it is called a row must-repair fault (or a must-repair faulty row line). Also, when there are k ($k>Rs$) faults at any singly column, it is called a column must-repair fault (or a must-repair faulty column line). Thus, the fault cells C of FIG. 1 are classified as a row must-repair fault.

A row must-repair fault is to be repaired by replacing it with a redundancy row. Also, a column must-repair fault is to be repaired by replacing it with a redundancy column. For example, the fault cells C of FIG. 1 may be repaired by replacing the row #5 with a redundancy row.

FIG. 2 illustrates a fault information storing device in accordance with an exemplary embodiment of the present invention.

Referring to FIG. 2, a fault information storing device in accordance with an exemplary embodiment of the present invention includes a plurality of parent memories PM_0~PM_X and a plurality of child memories CM_0~CM_Y. Each of the parent memories PM_0~PM_X stores a column address and a row address of one fault cell, and also stores information about whether a row repair is essential for the repair of the one fault cell and information about whether a column repair is essential for the repair of the one fault cell. Each of the child memories CM_0~CM_Y stores a column address of a fault cell having a row address identical to the row address stored in the corresponding parent memory, or stores a row address of a fault cell having a column address identical to the column address stored in the corresponding parent memory.

Each of the parent memories PM_0~PM_X stores information about a fault cell which does not share row and column addresses with fault cells stored in another parent memory, among the fault cells detected through a test process. For example, if an address of row 0 and column 3 is not stored in other parent memories when a fault cell at a row 0 and a column 3 is detected, the address of the fault cell (row 0 and column 3) is stored in the parent memory. Also, if the fault cell stored therein is classified as a must repair, the parent memory stores information about the must repair. A fault cell stored in the parent memory PM_0~PM_X is defined as a spare pivot fault cell.

Information stored in the parent memory is described below with reference to FIG. 2.

Parent Enable Flag:

A parent enable flag indicates whether the address stored in the corresponding parent memory is valid or not. If the parent enable flag is '1', the address stored in the corresponding parent memory is valid; and if the parent enable flag is '0', the address stored in the corresponding parent memory is invalid. The parent enable flag occupies a 1-bit storage space.

Row Address:

It means a row address of a fault cell stored in the corresponding parent memory. A storage space for the row address varies according to the number of bits of the row address. For example, if the row address is comprised of 10 bits, a 10-bit storage space is occupied to store the same. In FIG. 2, a reference M denotes the number of all rows. If the reference M is 1024, the row address may be comprised of 10 bits ($\log_2 1024$).

Column Address:

It means a column address of a fault cell stored in the corresponding parent memory. A storage space for the column address varies according to the number of bits of the column address. For example, if the column address is comprised of 10 bits, a 10-bit storage space is occupied to store the same. In FIG. 2, a reference N denotes the number of all columns. If the reference N is 512, the column address may be comprised of 9 bits ($\log_2 512$).

Row Must Flag:

A row must flag indicates whether the fault cell of the row address stored in the corresponding parent memory is classified as a row must-repair fault. If the row must flag is '1', it indicates a row must-repair fault; and if the row must flag is '0', it is not a row must-repair fault. The row must flag occupies a 1-bit storage space.

Column Must Flag:

A column must flag indicates whether the fault cell of the column address stored in the corresponding parent memory is classified as a column must-repair fault. If the column must flag is '1', it indicates a column must-repair fault; and if the column must flag is '0', it is not a column must-repair fault. The column must flag occupies a 1-bit storage space.

The parent memories PM_0~PM_X are as many as the total redundancy number, i.e., Rs+Cs. The number of faults storable by all the parent memories PM_0~PM_X is equal to the total redundancy number. If the number of fault cells to be stored in the parent memories PM_0~PM_X is greater than Rs+Cs, it is classified as a fault-unrepairable memory.

The child memory CM_0~CM_Y corresponds to one of the parent memories PM_0~PM_X. The child memory CM_0~CM_Y shares a column address or a row address with the corresponding parent memory PM_0~PM_X. The child memory CM_0~CM_Y stores information about a fault cell having the column address or the row address stored in the corresponding parent memory PM_0~PM_X, among the fault cells detected through a test process. If the row address of the detected fault cell is already stored in any one (A) of the parent memories, information about the detected fault cell is stored in the child memory corresponding to the parent memory A. Also, if the column address of the detected fault cell is already stored in any one (B) of the parent memories, information about the detected fault cell is stored in the child memory corresponding to the parent memory B. For example, if a row address 0 and a column address 3 are already stored in the parent memory PM_1, when a fault cell at a row 0 and a column 2 is detected, the column address of the fault cell (the column address 2) is stored in the child memory corresponding to the parent memory PM_1. A fault cell stored in the child memory CM_0~CM_Y is defined as a non-spare pivot fault cell.

Information stored in the child memory is described below with reference to FIG. 2.

Child Enable Flag:

A child enable flag indicates whether the address stored in the corresponding child memory is valid or not. If the child enable flag is '1', the address stored in the corresponding child memory is valid; and if the child enable flag is '0', the address stored in the corresponding child memory is invalid. The enable flag occupies a 1-bit storage space.

Row or Column Address:

It means a row or column address of a fault cell stored in the corresponding child memory. The child memory stores a row or column address of the fault cell. A storage space for the address is determined by the larger one of the number of bits of a row address and the number of bits of a column address. For example, if the row address is 9 bits and the column address is 10 bits, the storage space for storing the address occupies 10 bits in the child memory.

Address Information (Child Address Descriptor):

Address information indicates whether the address stored in the corresponding child memory is a row address or a column address. If the address information is '0', the address stored in the corresponding child memory is a row address; and if the address information is '1', the address stored in the corresponding child memory is a column address. The address information occupies a 1-bit storage space.

Pointer Information (Parent CAM Pointer):

Pointer information represents the parent memory corresponding to the child memory. For example, if the pointer information is '4', it indicates that the child memory corresponds to the parent memory PM_4. The number of bits of the pointer information is determined according to the number of parent memories ((=Rs+Cs). Specifically, the number of bits of the pointer information is $\log_2(Rs+Cs)$.

The child memories are as many as {Rs(Cs−1)+Cs(Rs−1)}. The sum of the number of parent memories and the number of child memories is 2×Rs×Cs. This is equal to the maximum number of fault addresses to be stored to find the optimal repair solution of the memory that is repairable through a given redundancy circuit.

The fault information storing device in accordance with the present invention classifies information about fault cells according to the characteristics of fault. A fault cell stored in the parent memory and the corresponding child memory corresponds to a line fault. A fault cell stored in the parent memory without the corresponding child memory corresponds to a single fault. Also, a fault cell stored in the parent memory storing an activated must flag corresponds to a must-repair fault.

Figure 3:
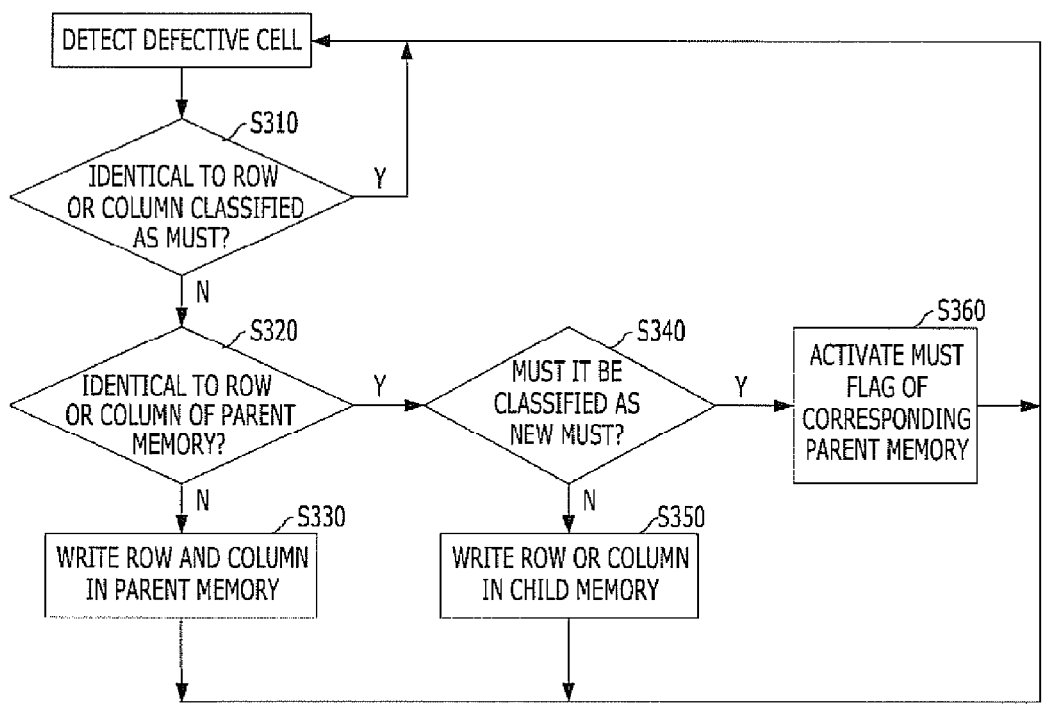
FIG. 3 is a flow diagram illustrating a method for storing fault information in the fault information storing device of FIG. 2 in accordance with an exemplary embodiment of the present invention.

FIG. 3 is a flow diagram illustrating a method for storing fault information in the fault information storing device of FIG. 2 in accordance with an exemplary embodiment of the present invention.

Referring to FIG. 3, when a fault cell is detected, it is determined whether the detected fault cell belongs to a row address classified as a must repair or a column address classified as a must repair (S310). If it is determined that the detected fault cell belongs to a must repair, information about the detected fault cell may be ignored because it is no more necessary. That is, information about the fault cell detected at a column address or a row address classified as a must repair is not stored.

On the other hand, when the detected fault cell is determined not to belong to a must repair, it is determined whether the address identical to the column address or the row address of the detected fault cell is already stored in the parent memory (S320). If the column address and the row address of the detected fault cell are not already stored in the parent memory, the column address and the row address of the detected fault cell are written in the parent memory (S330).

If one of the column address and the row address of the detected fault cell is already stored in the parent memory, it is determined whether the fault to be classified as a new must-repair fault is generated by the detected fault cell (S340). If the fault to be classified as a new column must-repair fault or a new row must-repair fault is generated by the detected fault cell, a must-repair flag of the parent memory corresponding to the detected fault cell (i.e., the parent memory storing the column address or the row address identical to that of the detected fault cell) is activated (S360). Here, if the fault classified as a new must-repair fault is a column must-repair fault, a column must-repair flag is activated; and if the fault classified as a new must-repair fault is a row must-repair fault, a row must-repair flag is activated.

If the fault to be classified as a new must-repair fault is not generated, the column address or the row address of the detected fault cell is stored in the child memory (S350).

That is, in accordance with the present invention, if a fault cell is detected, the detected fault cell is ignored (S310), the column address and the row address of the detected fault cell are stored in the parent memory (S330), the must-repair flag of the parent memory is activated by the detected fault cell (S360), or the column address or the row address of the detected fault cell are stored in the child memory (S350).

The process of FIG. 3 may be repeated whenever a fault cell is detected.

Figure 4:
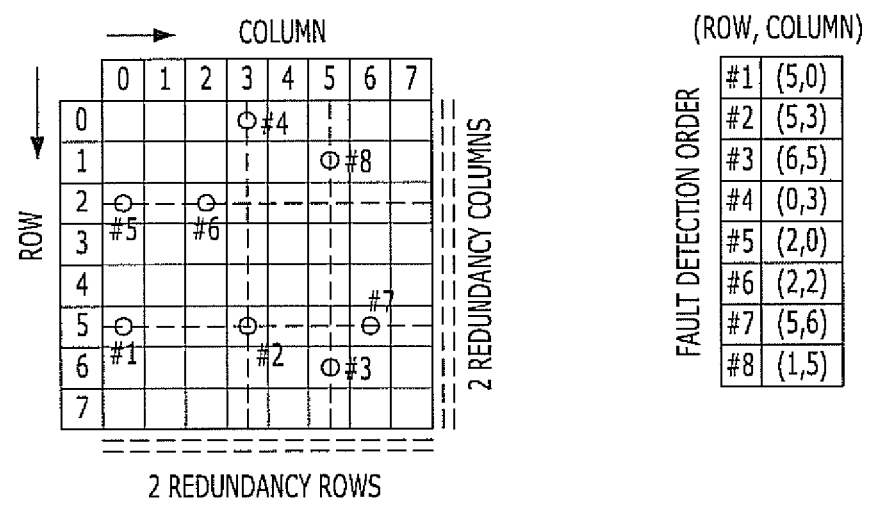
Figure 5:
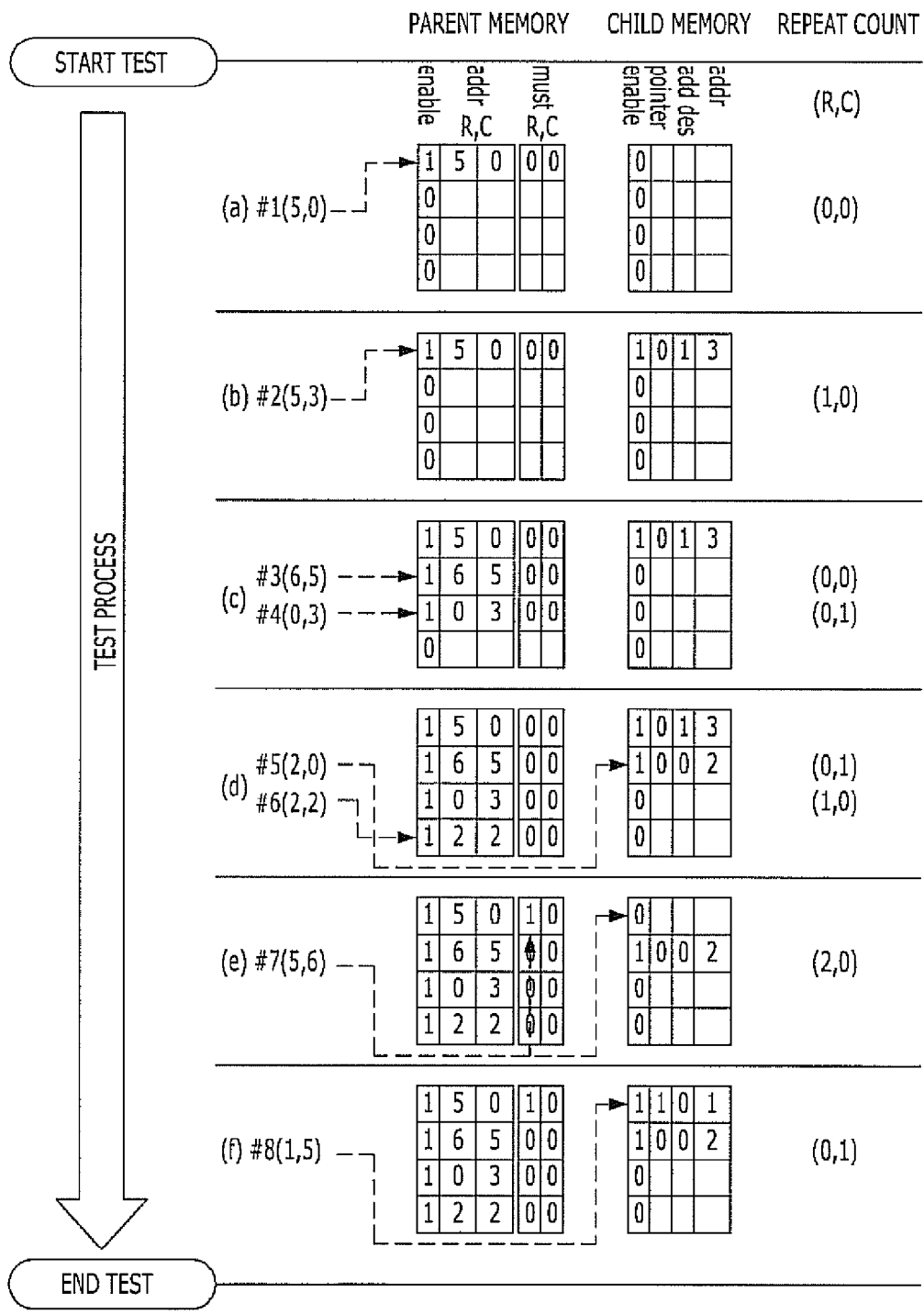
FIG. 5 illustrates a process of storing information about the fault cells, detected in the order of FIG. 4, in the fault information storing device in accordance with an exemplary embodiment of the present invention.

FIG. 4 illustrates fault cells detected in a memory device, which includes 8 rows and 8 columns and includes 2 redundancy rows (Rs) and 2 redundancy columns (Cs), and the order of detecting the fault cells. FIG. 5 illustrates a process of storing information about the fault cells, detected in the order of FIG. 4, in the fault information storing device in accordance with an exemplary embodiment of the present invention. A process of storing information about fault cells in the fault information storing device in accordance with an exemplary embodiment of the present invention is described below in detail with reference to FIGS. 4 and 5.

In FIG. 5, a repeat count value indicates the number of fault cells that are previously detected at the row address of a current-detected fault cell and the number of fault cells that are previously detected at the column address of the current-detected fault cell. The repeat count value is used to determine which place information about the current-detected fault cell is to be stored in. However, the repeat count value is not stored in the fault information storing device.

Referring to a process (a) of FIG. 5, a fault cell #1 is the first detected fault cell. The column address (0) and the row address (5) of the fault cell #1 are compared with the column address and the row address stored in the parent memory PM_0~PM_3. However, because none of the column address and the row address was written in the parent memory PM_0~PM_3 at the time of detection of the fault cell #1, the column address (0) and the row address (5) of the fault cell #1 are written in the parent memory PM_0. It can be seen from the process (a) of FIG. 5 that the parent enable flag of the parent memory PM_0 is written as '1', the row address ADDR R is written as '5', and the column address ADDR C is written as '0'.

Referring to a process (b) of FIG. 5, when a fault cell #2 is detected, the column address (3) and the row address (5) of the fault cell #2 are compared with the column address and the row address stored in the parent memory PM_0~PM_3. Because the row address (5) of the fault cell #2 is identical to the row address (5) written in the parent memory PM_0, the column address (3) of the fault cell #3 is written in the child memory CM_0. The child enable flag of the child memory CM_0 is written as '1', the address ADDR is written as '3', and the address information ADD DES is written as '1' to indicate that the written address is a column address. Also, the pointer information POINTER is written as '0' to indicate that the child memory CM_0 corresponds to the parent memory PM_0.

Referring to a process (c) of FIG. 5, the column address (5) and the row address (6) of a fault cell #3 are not identical to the address that is previously written in the parent memory PM_0~PM_3, and the column address (3) and the row address (0) of a fault cell #4 are not identical to the address that is previous written in the parent memory PM_0~PM_3. Thus, the column address (5) and the row address (6) of the fault cell #3 are written in the parent memory PM_1, and the column address (3) and the row address (0) of the fault cell #4 are stored in the parent memory PM_2.

Referring to a process (d) of FIG. 5, the column address (0) of a fault cell #5 is identical to the column address (0) that is previous written in the parent memory PM_0. Thus, the row address (2) of the fault cell #5 is stored in the child memory CM_1. The child enable flag ENABLE of the child memory CM_1 is written as '1', the address ADDR is written as '2', and the address information ADD DES is written as '0' to indicate that the written address is a row address. Also, the pointer information POINTER is written as '0' to indicate that the child memory CM_1 corresponds to the parent memory PM_0. Because the column address (2) and the row address (2) of a fault cell #6 are not identical to the address written in the parent memory PM_0~PM_3, the fault cell #6 is written in the parent memory PM_3.

Referring to a process (e) of FIG. 5, the row address (5) of a fault cell #7 is identical to the row address (5) written in the parent memory PM_0. Here, it can be seen that the repeat count value is (2,0), and it indicates that number of fault cells previously detected at the row address (5) of the fault cell #7 is 2. The number of fault cells generated at the row address (5) (if including the fault cell #7) becomes 3 that exceeds the number of redundancy columns (Cs=2). Then, all the fault cells #1, #2 and #7 sharing the row address (5) are to be classified as a row must-repair fault. Thus, the row must-repair flag MUST R of the parent memory PM_0 is activated to '1'. Also, because information about the fault cell #2 generated at the row address (5) does not need to be stored any more, the child enable flag ENABLE of the child memory CM_0 is deactivated to '0'.

Referring to a process (f) of FIG. 5, the column address (5) of a fault cell #8 is identical to the column address (5) written in the parent memory PM_1. Thus, the child enable flag ENABLE of the child memory CM_0 is written as '1', the address ADDR is written as '1', the address information ADD DES is written as '0' to indicate that the written address is a row address, and the pointer information POINTER is written as '1' to indicate that the child memory corresponds to the parent memory PM_1.

Through the processes (a) to (f) of FIG. 5, complete information for repairing the fault cells is stored in the fault information storing device. According to the information stored in the fault information storing device, the address of a row must repair and the address of a column must repair can be detected, and the locations of fault cells having other faults than the must-repair fault can be detected.

That is, an address of a must-repair fault which needs no analyzing is generated. Also, because the locations of all fault cells with a single fault and a line fault which need analyzing can be detected, the detected locations of the fault cells are analyzed to determine how to repair the single fault and the line fault. Thus, the present invention can achieve a 100% repair rate by using the information stored in the fault information storing device.

Hereinafter, a description will be given of a method for calculating a repair solution by using information about fault cells.

When collection of information about fault cells is completed, the row address and the column address of a spare pivot fault cell are stored in the parent memory PM_0~PM_X, and one of the row address and the column address of a non-spare pivot fault cell is stored in the child memory CM_0~CM_Y. Also, both of the row address and the column address of a non-spare pivot fault cell may be detected with reference to the information stored in the child memory and the corresponding parent memory. As many redundancy lines as the number of spare pivot fault cells are necessary to repair all the spare pivot fault cells in the memory device. Each of the spare pivot fault cells may be repaired by replacing a row line of the corresponding fault cell with a redundancy row line or by replacing a column line of the corresponding fault cell with a redundancy column line. The number of spare pivot fault cells is equal to the number of parent memories (Rs+Cs). Also, on the assumption that information stored in all the parent memories is valid, the number of possible repair solution candidates is equal to (Rs+Cs)!/(Rs!)*(Cs!). If the memory device is repairable, at least one of the repair solution candidates is to cover all the non-spare pivot fault cells. The repair solution candidate may be generated by selecting as many row addresses as the number of redundancy rows (Rs) among the stored row addresses and by selecting as many column addresses as the number of redundancy columns (Cs) among the stored column addresses.

It is assumed that $Px_i$(i=1, 2, ... Rs) is row addresses selected among the row addresses of spare pivot fault cells stored in the parent memory, and $PEx_i$ is a parent enable flag value of the parent memory storing $Px_i$. Likewise, it is assumed that $Py_j$(j=1, 2, ..., Cs) is column addresses selected among the column addresses of spare pivot fault cells stored in the parent memory, and $PEy_j$ is a parent enable flag value of the parent memory storing $Py_j$. Also, it is assumed that $Cx_k$, $Cy_k$, $CE_k$(k=1, 2, ... (Rs(Cs−1)+Cs(Rs−1))) are respectively the row address, the column address and the child enable flag of a non-spare pivot fault call stored in the child memory. Then, the analysis results of the repair solution candidates may be expressed by Boolean operators.

Row_Cover$_k$ indicates whether the row address of the $k^{th}$ child memory is included in $Px_i$. Row_Cover$_k$ is expressed as Equation 2 below.

$$\text{Row\_Cover}_k = \prod_{i=1}^{Rs} \{(Px_i \oplus Cx_k) + \overline{PEx_i}\} \qquad \text{Eq. 2}$$

Row_Cover$_k$ indicates whether the row address of the $k^{th}$ child memory is included in any $Px_i$. If the row address of the $k^{th}$ child memory is included in any $Px_i$, Row_Cover$_k$ is '0'; and if not, Row_Cover$_k$ is '1'. $PEx_i$ is included in Equation 2, and this is because all the addresses stored in all the parent memories are not valid.

Col_Cover$_k$ indicates whether the column address of the $k^{th}$ child memory is included in $Py_j$. Col_Cover$_k$ is expressed as Equation 3 below.

$$\text{Col\_Cover}_k = \prod_{j=1}^{Cs} \{(Py_j \oplus Cy_k) + \overline{PEy_j}\} \qquad \text{Eq. 3}$$

Col_Cover$_k$ indicates whether the column address of the $k^{th}$ child memory is included in any $Py_j$. If the column address of the $k^{th}$ child memory is included in any $Py_j$, Col_Cover$_k$ is '0'; and if not, Col_Cover$_k$ is '1'. $PEy_j$ is included in Equation 3, and this is because all the addresses stored in all the parent memories are not valid.

On the basis of Row_Cover$_k$ obtained by Equation 2 and Col_Cover$_k$ obtained by Equation 3, Cover$_k$ is expressed as Equation 4.

$$\text{Cover}_k = \{(\text{Row\_Cover}_k \cdot \text{Col\_Cover}_k) \cdot CE_k\} \qquad \text{Eq. 4}$$

If the address of a fault cell (a non-spare pivot fault cell) stored in the $k^{th}$ child memory is included in any $Px_i$ or any $Py_j$, Cover$_k$ is '0'; and if not, Cover$_k$ is '1'. $CE_k$ is included in Equation 4. $CE_k$ is '0' if the address stored in the $k^{th}$ child memory is invalid. If $CE_k$ is '0', the fault cell stored in the $k^{th}$ child memory need not be repaired and Cover$_k$ becomes '0'.

On the basis of Cover$_k$ obtained by Equation 4, an analysis value is expressed as Equation 5 below.

$$\text{Analysis} = \sum_{k=1}^{C_{CNT}} \text{Cover}_k \qquad \text{Eq. 5}$$

where CCNT=(Rs(Cs−1)+Cs(Rs−1)).

If the addresses of fault cells (all non-spare pivot fault cells) stored in all the child memories are included in any $Px_i$ or any $Py_j$, the analysis value is '0'; and if not, the analysis value is '1'. If the analysis value is '0', it indicates that all the non-spare pivot fault cells can be repaired simultaneously in the process of repairing the spare pivot fault cell.

Figure 6:
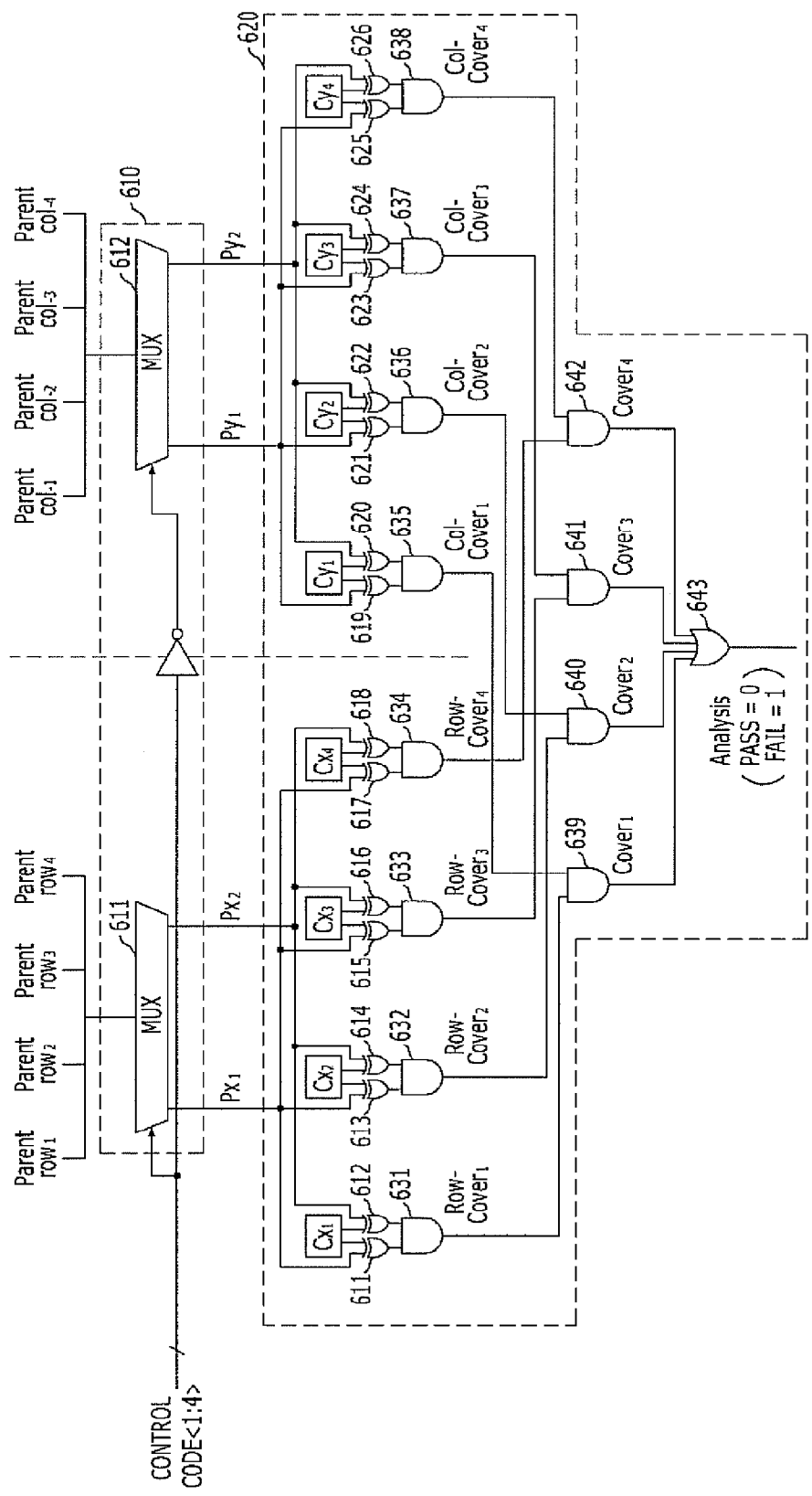
FIG. 6 illustrates a repair analysis device in accordance with an exemplary embodiment of the present invention.

FIG. 6 illustrates a repair analysis device in accordance with an exemplary embodiment of the present invention. FIG. 6 illustrates an exemplary case where the number of redundancy rows (Rs) is 2 and the number of redundancy columns (Cs) is 2.

Referring to FIG. 6, a repair analysis device in accordance with an exemplary embodiment of the present invention includes a selection unit 610 and an analysis unit 620. The selection unit 610 is configured to select a portion of the row addresses Parent row$_1$~Parent row$_4$ and a portion of the column addresses Parent col$_1$~Parent col$_4$ of a plurality of spare pivot fault cells in response to a control code CONTROL CODE<1:4>. The analysis unit 620 is configured to generate an analysis signal indicating whether the row addresses Cx$_1$~Cx$_4$ of a plurality of non-spare pivot fault cells are included in row addresses Px$_1$~Px$_2$ selected by the selection unit 610 and whether the column addresses Cy$_1$~Cy$_4$ of a plurality of non-spare pivot fault cells are included in column addresses Py$_1$~Py$_2$ selected by the selection unit 610.

The row addresses Parent row$_1$~Parent row$_4$ are the row addresses of spare pivot fault cells (i.e., fault cells stored in the parent memory), and column addresses Parent col$_1$~Parent col$_4$ are the column addresses of the spare pivot fault cells. The control code CONTROL CODE<1:4> indicates which of a row redundancy line and a column redundancy line is to replace a spare pivot fault cell. If the control code CONTROL CODE<1:4> is '1', it indicates that the spare pivot fault cell is replaced with a row redundancy line. If the control code CONTROL CODE<1:4> is '0', it indicates that the spare pivot fault cell is replaced with a column redundancy line. For example, if the control code CONTROL CODE<1:4> is '1010', it indicates that the first and third spare pivot fault cells are repaired by a redundancy row and the second and fourth spare pivot fault cells are repaired by a redundancy column. The number of bits having a value of '1' in the control code CONTROL CODE<1:4> is equal to the number of redundancy rows (Rs), and the number of bits having a value of '0' is equal to the number of redundancy columns (Cs).

In response to the control code CONTROL CODE<1:4>, the selection unit 610 selects the row address of spare pivot fault cells to be repaired by a row redundancy line and the column addresses of spare pivot fault cells to be repaired by a column redundancy line. The selection unit 610 may include two multiplexers 611 and 612 as illustrated in FIG. 6. The multiplexer 611 outputs the row address corresponding to the bit having a value of '1' in the control code CONTROL CODE<1:4> as $Px_1$ and $Px_2$. For example, if the control code CONTROL CODE<1:4> has a value of '1010', the row address Parent $row_1$ is outputted as $Px_1$ and the row address Parent $row_3$ is outputted as $Px_2$. The multiplexer 612 outputs the column address corresponding to the bit having a value of '0' in the control code CONTROL CODE<1:4> as $Py_1$ and $Py_2$. For example, if the control code CONTROL CODE<1:4> has a value of '1100', the column address Parent $col_3$ is outputted as $Py_1$ and the column address Parent $col_4$ is outputted as $Py_2$.

The analysis unit 620 generates an analysis signal indicating whether the row addresses $Cx_1 \sim Cx_4$ of non-spare pivot fault cells (i.e., fault cells stored in the child memory) are included in the row addresses $Px_1 \sim Px_2$ selected by the selection unit 610 and the column addresses $Cy_1 \sim Cy_4$ of the non-spare pivot fault cells are included in the column addresses $Py_1 \sim Py_4$ selected by the selection unit 610. As illustrated in FIG. 6, the analysis unit 620 may include XOR gates 611~626, AND gates 631~642, and an OR gate 643.

If $Px_1$ and $Cx_1$ are equal to each other, the XOR gate 611 outputs '0'; and if not, the XOR gate 611 outputs '1'. If $Px_2$ and $Cx_1$ are equal to each other, the XOR gate 612 outputs '0'; and if not, the XOR gate 612 outputs '1'. Thus, if $Cx_1$ is equal to one of $Px_1$ and $Px_2$, Row $Cover_1$ outputted from the AND gate 631 is '0'. Likewise, Row $Cover_2$, Col $Cover_1$, and Col $Cover_2$ are generated. The generated Row $Cover_{1\sim2}$ and Col $Cover_{1\sim2}$ have the same meaning as those described in relation to Equation 2 and Equation 3.

The AND gate 639 receives Row $CoveR_1$ and Col $Cover_1$ and outputs $Cover_1$. If both Row $Cover_1$ and Col $Cover_1$ are '1', $Cover_1$ is '1'; and if not, $Cover_1$ is '0'. If $Cover_1$ is '0', it means that a non-spare pivot fault cell having an address of ($Cx_1$, $Cy_1$) can be repaired simultaneously in the process of repairing spare pivot fault cells. $Cover_{2\sim4}$ are generated in the same manner as $Cover_1$, and $Cover_{1\sim4}$ have the same meaning as those described in relation to Equation 4.

The OR gate 643 receives Col $Cover_{1\sim4}$. If Col $Cover_{1\sim4}$ are all '0', the OR gate 643 outputs the analysis signal as '0'; and if not, the OR gate 643 outputs the analysis signal as '1'. If the analysis signal has a value of '0', the non-spare pivot fault cells are repaired simultaneously in the process of repairing the spare pivot fault cells in response to the control code CONTROL CODE<1:4>. If the analysis signal has a value of '1', the non-spare pivot fault cells are not repaired simultaneously in the process of repairing the spare pivot fault cells in response to the control code CONTROL CODE<1:4>. For example, if the analysis signal has a value of '0' when the control code CONTROL CODE<1:4> is '1010', all the non-spare pivot fault cells can be repaired simultaneously with the spare pivot fault cell by repairing the first and third spare pivot fault cells with a redundancy row and repairing the second and fourth spare pivot fault cells with a redundancy column. That is, the analysis signal has a very important meaning in finding a repair solution. The meaning of the analysis signal can be clearly understood with reference to Equation 5 and the description thereof.

The repair analysis device of FIG. 6 may analyze all the repair candidates by changing only the code value of the control code CONTROL CODE<1:4>.

Figure 7:
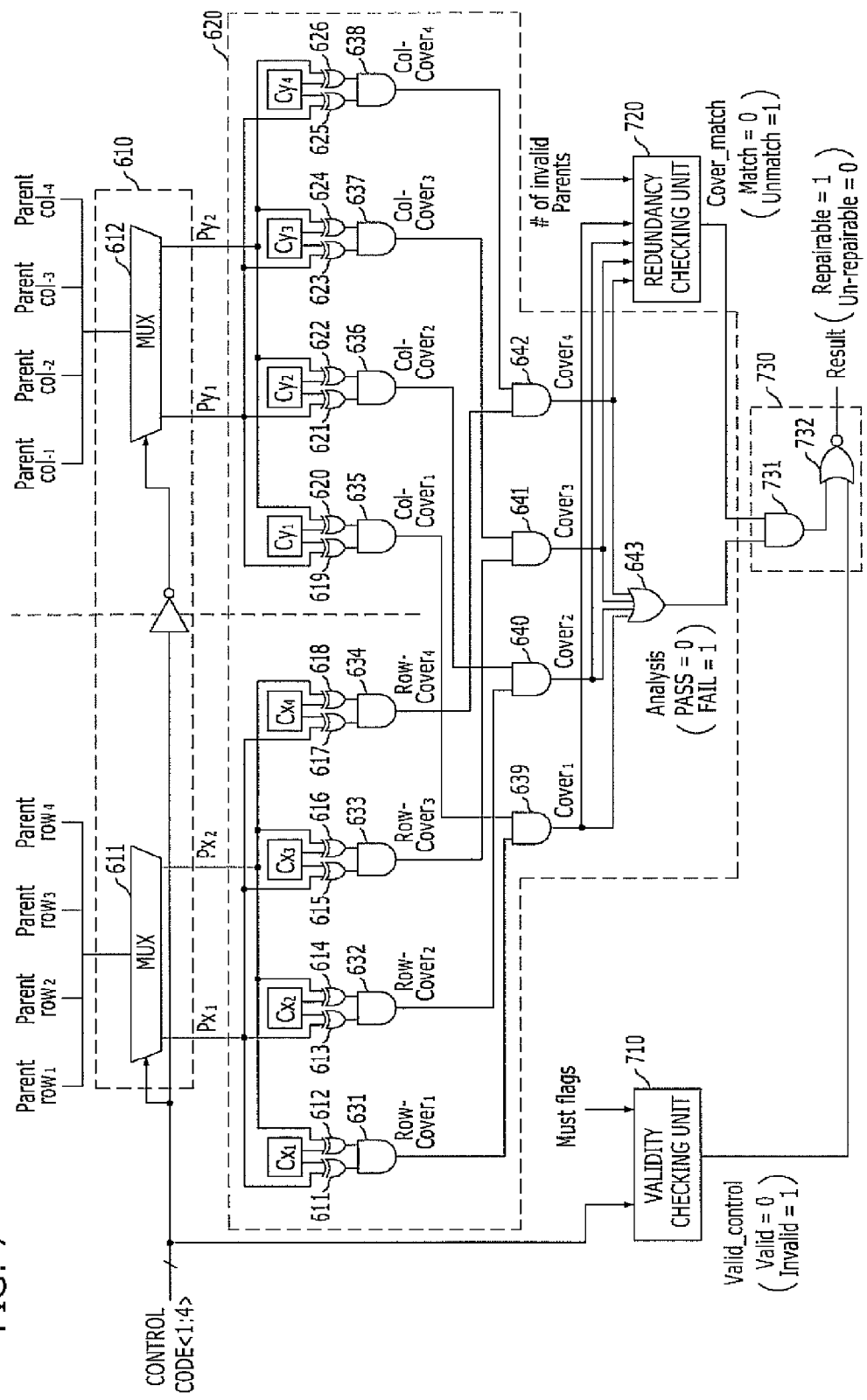
FIG. 7 illustrates that a repair analysis device in accordance with another exemplary embodiment of the present invention.

FIG. 7 illustrates a repair analysis device in accordance with another exemplary embodiment of the present invention.

Referring to FIG. 7, the repair analysis device may further include a validity checking unit 710 and a redundancy checking unit 720 with the structure described in FIG. 6.

The validity checking unit 710 generates a valid signal indicating whether a must row address and a must column address are included in the row addresses $Px_1 \sim Px_2$ and the column addresses $Py_1 \sim Py_2$ selected by the selection unit 610. As described above, a row must-repair fault is to be replaced with a redundancy row, and a column must-repair fault is to be replaced with a redundancy column. The validity checking unit 710 checks whether the repair method in response to the control code CONTROL CODE<1:4> is identical to the repair method of a must-repair fault. For example, if the first spare pivot fault cell corresponds to a row must repair fault, the first spare pivot fault cell is to be replaced with a redundancy row. Then, the first bit CONTROL CODE<1> of the control code CONTROL CODE<1:4> is to be '1', and the validity checking unit 710 checks whether the first bit CONTROL CODE<1> of the control code CONTROL CODE<1:4> is '1'.

The validity checking unit 710 receives the control code CONTROL CODE<1:4> and information about a must repair (i.e., must flags) to check whether the repair method in response to the control code is suitable for the repair of a must fault. If the repair method in response to the control code is suitable for the repair of a must fault, the validity checking unit 710 outputs the valid signal as '0'; and if not, the validity checking unit 710 outputs the valid signal as '1'. Thus, if the valid signal has a value of '0', the must fault can be repaired by the repair method in response to the control code CONTROL CODE<1:4>.

The validity checking unit 720 generates a redundancy signal Cover_match indicating whether the sum of the number of row addresses of non-spare pivot fault cells, which are not included in the row addresses $Px_1 \sim Px_2$ selected by the selection unit 610, and the number of column addresses of non-spare pivot fault cells, which are not included in the column addresses $Py_1 \sim Py_4$ selected by the selection unit 610, is smaller than or equal to the number of remaining redundancy lines. Here, the number of the remaining redundancy lines means the number of redundancy lines except for the redundancy lines for the repair of spare pivot fault cells, i.e., {Rs+Cs–(Number of valid spare pivot fault cells)}.

Even if one of the non-spare pivot fault cells fails to be repaired in the process of repairing the spare pivot fault cells, if there is a remaining redundancy line, the one can be repaired. The redundancy checking unit 720 checks this. For example, if Rs+Cs=4 and the number of spare pivot fault cells is 3 (i.e., one remaining redundancy line), even if one non-spare pivot fault cell cannot be repaired in the process of repairing three spare pivot fault cells, one unrepairable non-spare pivot fault cell can be repaired by the remaining redundancy line.

If the redundancy signal Cover_match has a value of '0', it means that the number of fault cells failing to be repaired in the process of repairing the spare pivot fault cells among the non-spare pivot fault cells is smaller than or equal to the number of remaining redundancy lines; and if the redundancy signal Cover_match has a value of '1', it means that the number of fault cells failing to be repaired in the process of repairing the spare pivot fault cells among the non-spare pivot fault cells is larger than the number of remaining redundancy lines. That is, if the redundancy signal Cover_match has a value of '0', even if the analysis signal has a value of '1', the fault cells can be repaired by a repair method in response to the control code CONTROL CODE<1:4>.

The redundancy checking unit 720 generates the redundancy signal Cover_match by receiving Cover1~Cover4 and the number of parent memories storing invalid fault cell information (# of invalid Parents) (i.e., the number of parent memories with a deactivated parent enable signal). If the number of Cover1~Cover4 with a value of '1' is smaller than or equal to the number of parent memories storing invalid fault cell information (# of invalid Parents), the redundancy signal Cover_match is '0'; and if not, the redundancy signal Cover_match is '1'.

A result signal generating unit 730 generates a result signal by using the analysis signal, the valid signal and the redundancy signal Cover_match. If one of the analysis signal and the redundancy signal Cover_match has a value of '0' and the valid signal has a value of '0', the result signal generating unit 730 outputs the result signal as '0'; and if not, the result signal generating unit 730 outputs the result signal as '1'. If the result signal has a value of '0', it indicates that the repair solution in response to the control code CONTROL CODE<1:4> is a complete repair solution; and if the result signal has a value of '1', it indicates that the repair solution in response to the control code CONTROL CODE<1:4> is not a complete repair solution. As illustrated in FIG. 7, the result signal generating unit 730 may include an AND gate 731 and a NOR gate 732.

The repair analysis device of FIG. 7 generates the result signal indicating whether the repair solution in response to the control code CONTROL CODE<1:4> is a correct repair solution capable of repairing all the fault cells in the memory device. A correct repair solution may be selected by changing the control code CONTROL CODE<1:4>.

The repair analysis device described with reference to FIGS. 6 and 7 does not depend on the fault information storing device described with reference to FIGS. 2 to 5. Information about fault cells can be analyzed by the repair analysis device if the information about fault cells is stored in any way.

FIGS. 6 and 7 illustrate an exemplary case where the number of redundancy rows (Rs) is 2 and the number of redundancy columns (Cs) is 2. However, the present invention is not limited thereto. The repair analysis device of FIGS. 6 and 7 may be embodied in different manners according to the number of redundancy rows (Rs) and the number of redundancy columns (Cs).

Figure 8:
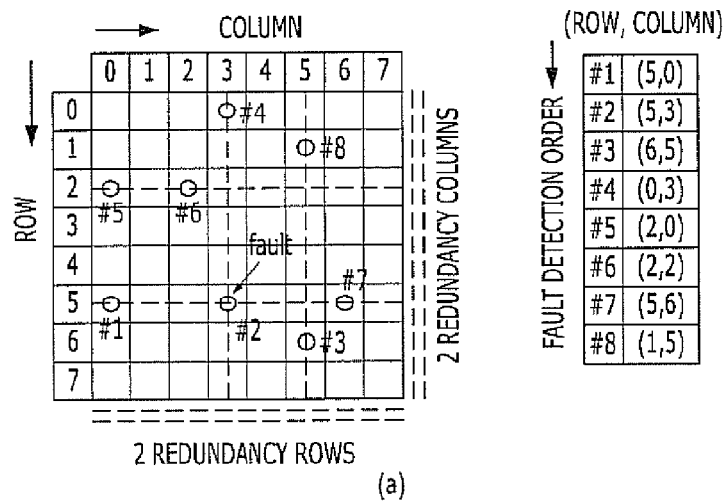
FIG. 8 illustrates a pattern of fault cells detected in a memory and the order of detecting the fault cells (a), a fault information storing device storing information about the fault cells (b), and the analysis results of a repair analysis device (c).

FIG. 8 illustrates a pattern of fault cells detected in a memory and the order of detecting the fault cells (a), a fault information storing device storing information about the fault cells (b), and the analysis results of a repair analysis device (c).

Referring to FIG. 8, the addresses of spare pivot fault cells are (5,0), (6,5), (0,3), and (2,2), and the addresses of non-spare pivot fault cells are (1,5) and (2,0).

Referring to a reference numeral '801' of FIG. 8, if the control code CONTROL CODE<1:4> has a value of '1001', all the fault cells can be repaired by replacing the first and fourth spare pivot fault cells with a redundancy row and replacing the second and third spare pivot fault cells with a redundancy column. In this case, the valid signal has a value of '0', the analysis signal has a value of '0', the redundancy signal Cover_match has a value of '0', and the result signal has a value of '1'.

For reference, a reference X in FIG. 8C denotes invalid column addresses or row addresses.

Figure 9:
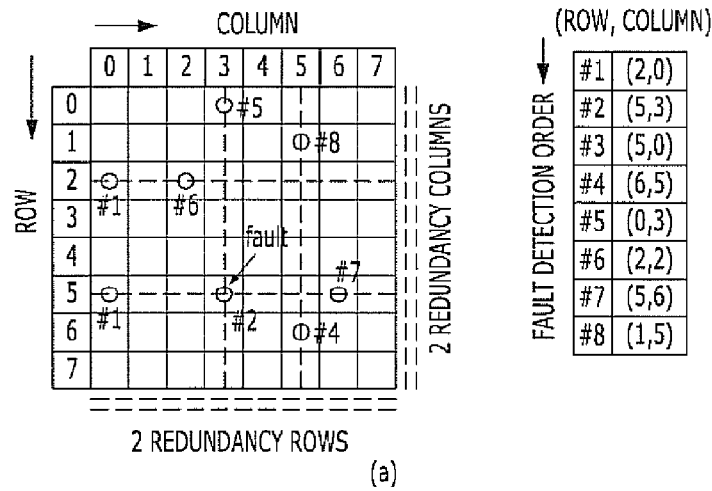
FIG. 9 illustrates another pattern of fault cells detected in a memory and the order of detecting the fault cells (a), a fault information storing device storing information about the fault cells (b), and the analysis results of a repair analysis device (c).

FIG. 9 illustrates another pattern of fault cells detected in a memory and the order of detecting the fault cells (a), a fault information storing device storing information about the fault cells (b), and the analysis results of a repair analysis device (c).

Referring to FIG. 9, the addresses of spare pivot fault cells are (2,0), (5,3), and (6,5), and the addresses of non-spare pivot fault cells are (1,5), (0,3), and (2,2).

Referring to a reference numeral '901' of FIG. 9, if the control code CONTROL CODE<1:4> has a value of '1100', all the fault cells can be repaired by replacing the first and second spare pivot fault cells with a redundancy row and replacing the third spare pivot fault cell with a redundancy column. Although the control code CONTROL CODE<1:4> has a value of '1100', the fourth bit CONTROL CODE<4> of the control code CONTROL CODE<1:4> is irrelevant to the repair solution. This is because the fourth spare pivot fault cell is not a valid fault cell. The fact that the fourth spare pivot fault cell is not a valid fault cell can be seen from the fact that the fourth parent memory is deactivated in FIG. 9 (b).

In this case, the column line of the second non-spare pivot fault cell (0,3) may be replaced with a column redundancy line that is the remaining redundancy line. Referring to the reference numeral '901' of FIG. 9, the redundancy signal Cover_match has a value of '0' to indicate that this replacement can be performed.

As described above, the present invention can perform a redundancy analysis operation by one analysis circuit within a short time, thus reducing the area overhead.

Also, the present invention can examine all cases only by changing a control code, calculating a repair solution at a high speed.

Also, the present invention can achieve a 100% repair rate by using information about fault cells.

While the present invention has been described with respect to the specific embodiments, it will be apparent to those skilled in the art that various changes and modifications may be made without departing from the spirit and scope of the invention as defined in the following claims.

What is claimed is:

1. A device for repair analysis, comprising:
a selection unit configured to select a part of row addresses of a plurality of spare pivot fault cells and a part of column addresses of the spare pivot fault cells in response to a control code; and
an analysis unit configured to generate an analysis signal indicating whether row addresses of a plurality of non-spare pivot fault cells are included in selected row addresses and column addresses of the non-spare pivot fault cells are included in selected column addresses.

2. The device of claim 1, further comprising a validity checking unit configured to generate a valid signal indicating whether a must row address and a must column address are included in the selected row addresses and the selected column addresses, respectively.

3. The device of claim 2, further comprising a redundancy checking unit configured to generate a redundancy signal indicating whether the sum of the number of row addresses of the non-spare pivot fault cells, which are different from the selected row addresses, and the number of column addresses of the non-spare pivot fault cells, which are different from the selected column addresses, is smaller than or equal to the number of remaining redundancy lines.

4. The device of claim 3, wherein the number of the remaining redundancy lines is equal to a value obtained by subtracting the number of the spare pivot fault cells from the total number of row and column redundancy lines.

5. The device of claim 3, further comprising a result signal generating unit configured to generate a result signal in response to the analysis signal, the valid signal and the redundancy signal, wherein the result signal indicates whether a correct repair solution is generated in response to the control code.

6. The device of claim 5, wherein, if the correct repair solution is generated, row and column redundancy lines are used to replace row lines of the selected row addresses and column lines of the selected column address to repair the spare pivot fault cells and the non-spare pivot fault cells.

7. The device of claim 5, wherein the result signal generating unit activates the result signal indicating the generation of the correct repair solution, if at least one of the analysis signal and the redundancy signal is activated and the valid signal is activated.

8. The device of claim 7, wherein the analysis unit activated the analysis signal when the row or column address of each of the non-spare pivot fault cells is identical to at least one of the selected row addresses or at least one of the selected column addresses.

9. The device of claim 1, wherein the number of bits of the control code is equal to the total number of row and column redundancy lines.

10. The device of claim 9, wherein the number of activation bits among the bits of the control code is equal to the number of the row redundancy lines, and the number of deactivation bits among the bits of the control code is equal to the number of the column redundancy lines.

11. The device of claim 1, wherein
the row addresses of the spare pivot fault cells are different from each other,
the column addresses of the spare pivot fault cells are different from each other, and
each of the non-spare pivot fault cells has the same row address or column address as at least one of the spare pivot fault cells.

12. A method for repair analysis, comprising:
selecting a part of row addresses of a plurality of spare pivot fault cells and a part of column addresses of the spare pivot fault cells in response to a control code; and
determining whether row addresses of a plurality of non-spare pivot fault cells are included in selected row addresses and column addresses of the non-spare pivot fault cells are included in selected column addresses.

13. The method of claim 12, further comprising:
checking whether a must row address and a must column address are included in the selected row addresses and the selected column addresses.

14. The method of claim 13, further comprising:
examining whether the sum of the number of row addresses of the non-spare pivot fault cells, which are different from the selected row addresses, and the number of column addresses of the non-spare pivot fault cells, which are different from the selected column addresses, is smaller than or equal to the number of remaining redundancy lines.

15. The method of claim 14, wherein the results of the determining operation, the checking operation and the examining operation are used to determine whether a correct repair solution is generated in response to the control code.

16. The method of claim 14, wherein the number of the remaining redundancy lines is equal to a value obtained by subtracting the number of the spare pivot fault cells from the total number of row and column redundancy lines.

17. The method of claim 12, wherein
the row addresses of the spare pivot fault cells are different from each other,
the column addresses of the spare pivot fault cells are different from each other, and
each of the non-spare pivot fault cells has the same row address or column address as at least one of the spare pivot fault cells.

* * * * *